(12) United States Patent
Kim

(10) Patent No.: US 9,390,811 B2
(45) Date of Patent: Jul. 12, 2016

(54) SEMICONDUCTOR DEVICE WITH FUSE ARRAY AND METHOD FOR OPERATING THE SAME

(71) Applicant: SK hynix Inc., Gyeonggi-do (KR)

(72) Inventor: Kwi-Dong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/543,552

(22) Filed: Nov. 17, 2014

(65) Prior Publication Data

US 2015/0364210 A1    Dec. 17, 2015

(30) Foreign Application Priority Data

Jun. 16, 2014  (KR) .................. 10-2014-0072889

(51) Int. Cl.
| | | |
|---|---|---|
| G11C 17/00 | (2006.01) | |
| G11C 17/18 | (2006.01) | |
| G11C 17/16 | (2006.01) | |
| G11C 7/14  | (2006.01) | |
| G11C 29/02 | (2006.01) | |
| G11C 29/44 | (2006.01) | |

(52) U.S. Cl.
CPC .................. *G11C 17/18* (2013.01); *G11C 7/14* (2013.01); *G11C 17/16* (2013.01); *G11C 29/021*; (2013.01); *G11C 29/028* (2013.01); *G11C 2029/4402* (2013.01)

(58) Field of Classification Search
CPC ................................ G11C 17/16; G11C 17/18
USPC .................................................. 365/96, 225.7
See application file for complete search history.

(56) References Cited

U.S. PATENT DOCUMENTS

| | | | | |
|---|---|---|---|---|
| 2009/0154250 A1* | 6/2009 | Lin | ........................ | G11C 16/20 365/185.22 |
| 2013/0285709 A1* | 10/2013 | Oh | ........................ | G11C 29/027 327/109 |

FOREIGN PATENT DOCUMENTS

KR    1020140146867    12/2014

* cited by examiner

*Primary Examiner* — Huan Hoang
(74) *Attorney, Agent, or Firm* — IP & T Group LLP

(57) ABSTRACT

A semiconductor device includes a fuse array including verification fuses and normal fuses, a determination block suitable for reading data programmed in the verification fuses based on a read reference voltage and during a boot-up preparation section, determining whether or not a read value is the same as a predetermined value, and a level control block suitable for adjusting a level of the read reference voltage based on a determined result during the boot-up preparation section.

20 Claims, 5 Drawing Sheets

SEMICONDUCTOR DEVICE WITH FUSE ARRAY AND METHOD FOR OPERATING THE SAME

CROSS-REFERENCE TO RELATED APPLICATIONS

The present application claims priority of Korean Patent Application No. 10-2014-0072889, filed on Jun. 16, 2014, which is incorporated herein by reference in its entirety.

BACKGROUND

1. Field

Various embodiments of the present invention relate to a semiconductor design technology, and more particularly, to a semiconductor device with a fuse array.

2. Description of the Related Art

In general, semiconductor memory devices such as double data rate synchronous dynamic random access memory (DDR SDRAM) include a circuit for storing a repair target address or a predetermined setting value, and the circuit may include fuses. A fuse may store data through a program operation, and the program operation may be classified with into a physical scheme and an electrical scheme.

In the physical scheme, a fuse is cut by using a laser that blows the fuse according to data to be programmed. The fuse used in the physical scheme is referred to a physical-type fuse or a laser blowing-type fuse. The physical-type fuse ray be programmed only in a wafer stage before it is packaged.

In the electrical scheme, a connection state of a fuse is changed by applying an over-current to the fuse according to data to be programmed. The fuse used in the electrical scheme is referred to as an electrical-type fuse. The electrical-type fuse includes an anti-type fuse for changing an open state into a short state and a blowing-type fuse for changing a short state into an open state. Unlike the physical-type fuse in the electrical-type fuse, a program operation may be performed even in a package stage. Thus, the electrical-type fuse is generally used in a semiconductor device.

Since a semiconductor device is required to perform more diverse operations, the semiconductor device is designed to perform many functions. As the number of functions of the semiconductor device increases, the number of fuses for various functions also increases. Recently a fuse array structure has been introduced to manage a large number of fuses more efficiently.

SUMMARY

Various embodiments of the present invention are directed to a semiconductor device that may support an effective boot-up operation and stably read a fuse data.

In accordance with an embodiment of the present invention, a semiconductor device includes: a fuse array including verification fuses and normal fuses; a determination block suitable for reading data programmed in the verification fuses based on a read reference voltage and during a boot-up preparation section determining whether or not a read value is the same as a predetermined value; and a level control block suitable for adjusting the level of the read reference voltage based on the determined result during the boot-up preparation section.

The predetermined value may be a value, which is programmed in the verification fuses.

The determination block may include: a reading unit suitable for selecting and reading the data programmed in the verification fuses based on the read reference voltage during the boot-up preparation section; and a comparison unit suitable for comparing a read value of the reading unit with the predetermined value to generate a comparison signal, which is activated when a read value of the reading unit is the same as the predetermined value and deactivated when the read value of the reading unit is different from the predetermined value during the boot-up preparation section.

The semiconductor device may further include: an operation control block suitable for controlling the determination block and the level control block to repeatedly operate alternately based on a first repeat number of times, which is variable according to the comparison signal, during the boot-up preparation section.

The operation control block may start to control the determination block and the level control block to repeatedly operate alternately in response to an entry to the boot-up preparation section, and may stop controlling the determination block and the level control block to repeatedly operate alternately when the comparison signal is in an activated state while the determination block and the level control block repeatedly operate by a second repeat number of times, which is equal to or less than the first repeat number of times.

The operation control block may include: a counting unit suitable for changing a counting number of times based on the operation result of the determination block whenever the comparison signal of the activated state is generated, initializing the counting number of times when the comparison signal is deactivated, and generating an operation completion signal when the counting number of times reaches the second repeat number of times, during the boot-up preparation section; and an operation unit suitable for starting to control the determination block and the level control block to repeatedly operate in response to the entry to the boot-up preparation section, and stopping controlling the determination block and the level control block to repeatedly operate in response to the operation completion signal.

The reading unit may read data programmed in the normal fuses based on the read reference voltage having a level determined by the level control block during a boot-up section.

The semiconductor device may further include: an operation control block suitable for controlling the determination block and the level control block to repeatedly operate based on a third repeat number of times, which is fixed, to store the comparison signal generated at each repeat operation, during the boot-up preparation section.

The operation control block may include: a counting unit suitable for changing a counting number of times whenever the determination block and the level control block repeatedly operate to generate an operation completion signal when the counting number of times reaches the third repeat number of times during the boot-up preparation section; an operation unit suitable for starting to control the determination block and the level control block to repeatedly operate in response to the entry to the boot-up preparation section, and stopping control of the determination block and the level control block to repeatedly operate based on the operation completion signal; and a storage unit suitable for storing the comparison signal generated from the determination block whenever the determination block and the level control block repeatedly operate during the boot-up preparation section.

The semiconductor device may further include: a level determination block suitable for adjusting a level of the read reference voltage in response to a level change state of the comparison signal corresponding to the third repeat number of times stored in the storage unit after repeat operations of the determination block and the level control block are stopped by the operation control block, during the boot-up preparation section.

The reading unit may read data programmed in the normal fuses based on the read reference voltage adjusted by the level determination block, during a boot-up section.

In accordance with an embodiment of the present invention, a method for operating the semiconductor device with a fuse array including first fuses and second fuses may include: performing a first read operation by reading data programmed in the first fuses based on a read reference voltage to produce a read data, during a boot-up preparation section; performing a determination operation by determining whether or not a value of the read data is the same as a predetermined value, which is supposed to be programmed, to produce a determination result, during the boot-up preparation section; and performing a control operation by varying a level of the read reference voltage based on the determination result during the boot-up preparation section.

The performing of the determination operation may include: activating a comparison signal when a value of the read data is the same as the predetermined value, during the boot-up preparation section; and deactivating the comparison signal when a value of the read data is different from the predetermined value, during the boot-up preparation section.

The method for operating the semiconductor device may further include: alternately repeating the performing of the determination operation and the performing of the control operation according to a first repeat number of times, which is variable based on the comparison signal, during the boot-up preparation section.

The repeating of the operations may include: starting to alternately repeat the performing of the determination operation and the performing of the control operation in response to an entry to the boot-up preparation section; and stopping alternately repeating the performing of the determination operation and the performing of the control operation when the comparison signal is in an activated state while the repeating of the operations are successively performed by a second repeat number of times, which is equal to or less than the first repeat number of times.

The method for operating the semiconductor device may further include: performing a second read operation by reading data programmed in the second fuses is read based on the read reference voltage of which a voltage level is determined in the last control operation, during a boot-up section.

The method for operating the semiconductor device may further include: alternately repeating the performing of the determination operation and the performing of the control operation by a third repeat number of times, which is fixed, to store the comparison signal generated at each repeat performance, during the boot-up preparation section.

The repeating of the operations may include: starting to alternately repeat the performing of the determination operation and the performing of the control operation voltage in response to an entry to the boot-up preparation section; storing the comparison signal generated in the performing of the determination operation whenever the determination operation and the performing of the control operation are alternately repeated, during the boot-up preparation section; and stopping alternately repeating the performing of the determination operation and the performing of the control operation when the repeated number of times equals the third repeat number of times.

The method for operating the semiconductor device may further include: performing an additional control operation by adjusting a level of the read reference voltage in response to a level change state of the comparison signal corresponding to the stored third repeat number of times, after the repeating of the operations stops, during the boot-up preparation section; and performing a second read operation by reading data programmed in the second fuses based on a level of the read reference voltage determined in the performing of the additional control operation, during a boot-up section.

In accordance with an embodiment of the present invention, method for operating the semiconductor device with a fuse array including First fuses and second fuses may include: reading data programmed in the first fuses based on a read reference voltage during a boot-up preparation section; adjusting a level of the read reference voltage based on the read data during the boot-up preparation section; and reading data programmed in the second fuses based on the adjusted read reference voltage during a boot-up section.

DETAILED DESCRIPTION

Figure 1:
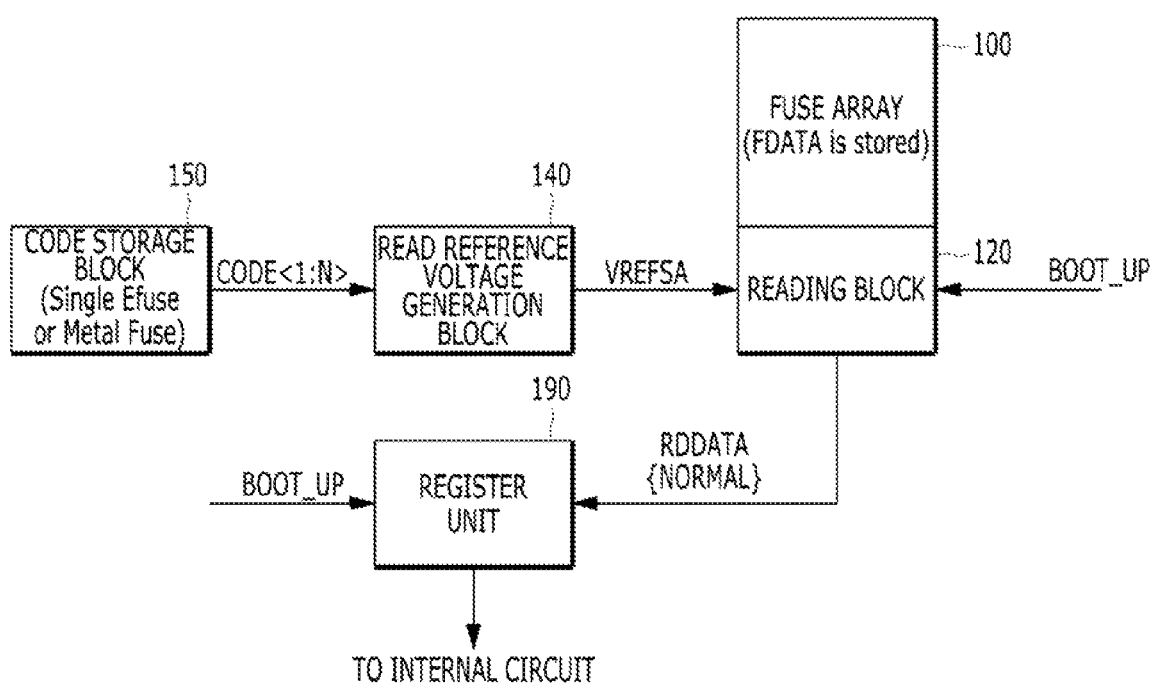
FIG. 1 is a block diagram illustrating a semiconductor device with a fuse array.

Hereafter, exemplary embodiments of the present invention are described below in more detail with reference to the accompanying drawings. The present invention may however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated to clearly illustrate features of the embodiments. In this specification, specific terms have been used. The terms are used to describe the present invention, and are not used to qualify the sense or limit the scope of the present invention.

It is also noted that in this specification, "and/or" represents that one or more of components arranged before and after "and/or" is included. Furthermore, "connected/coupled" refers to one component not only directly coupling another component but also indirectly coupling another component through an intermediate component. In addition, a singular form may include a plural form as long as it is not specifically mentioned in a sentence. Furthermore, "include/comprise" or "including/comprising" used in the specification represents that one or more components, steps, operations, and elements exists or are added.

FIG. 1 is a block diagram illustrating a semiconductor device with a fuse array.

Referring to FIG. 1, the semiconductor device includes a fuse array 100, a reading block 120, a read reference voltage generation block 140, a code storage block 150, and a register unit 190, The fuse array 100 includes a plurality of fuses (not shown) arranged in an array, and fuse data FDATA having predetermined values is stored in the fuses through a program operation.

The reading block 120 reads the fuse data FDATA stored in the fuse array 100 based on a level of a read reference voltage VREFSA during a boot-up section. A boot-up signal BOOT_UP is activated during the boot-up section.

The register unit 190 includes a plurality of registers or latches, and stores data RDDATA{NORMAL} which is read through the reading block 120 during the boot-up section. When the fuse data FDATA is required to be used in an internal circuit (not shown) of the semiconductor device, the fuse data FDATA is not directly transmitted from the fuse array 100 to the internal circuit, for example, a memory bank, but the fuse data FDATA, stored as the read data RDDATA{NORMAL}, is transmitted from the register unit 190 to the internal circuit. Thus, the internal circuit of the semiconductor device may rapidly receive and stably use the fuse data FDATA.

The read reference voltage generation block 140 generates the read reference voltage VREFSA according to a control code CODE<1:N>.

The code storage block 150 stores the control code CODE<1:N> whose value is predetermined.

Referring to the aforementioned structure, a boot-up operation of the fuse array in the semiconductor device goes through simple steps.

To begin with, the control code CODE<1:N> stored in the code storage block 150 is read and outputted to the read reference voltage generation block 140. The read reference voltage generation block 140 generates the read reference voltage VREFSA having a level corresponding to the value of the control code CODE<1:N>.

Subsequently, the fuse data FDATA programmed in the fuse array 100 are individually read and outputted as the read data RDDATA{NORMAL} based on the level of the read reference voltage VREFSA, and the read data RDDATA{NORMAL} stored in the register unit 190.

The boot-up operation may be performed in the simple steps because the control code CODE<1:N> whose value is predetermined stored in the code storage block 150. That is, since the control code CODE<1:N> having a proper value is stored in the code storage block 150, the read reference voltage VREFSA generated according to the control code CODE<1:N> may have a proper level so that the fuse data FDATA may be read as a predetermined value in the fuse array 100.

The control code CODE<1:N> whose value is predetermined may be stored in the code storage block 150 since the value of the control code CODE<1:N> is determined in advance through various training or test operations in semiconductor device design processes. That is, it is trained or tested in advance to determine what level of the read reference voltage VREFSA is appropriate for the fuse data FDATA to read as the predetermined value in the fuse array 100. The value of the control code CODE<1:N> for generating the proper level of the read reference voltage VREFSA is predetermined in the semiconductor device design processes.

As described above, performing the boot-up operation using the value of the control code CODE<1:N> which is predetermined, is advantageous in that the operation is quite simple but it may be disadvantageous in that the operation is vulnerable to a variation in a process, a voltage and a temperature, that is, a PVT variation. Once the value of the control code CODE<1:N> is determined in the semiconductor device design processes, there is no method for controlling or adjusting, the value of the control code CODE<1:N> in the subsequent processes of using the semiconductor device. Therefore, when the value of the control code CODE<1:N> is recognized as an unintentional value due to the PVT variation, and the boot-up operation is not normally performed, the semiconductor device may not be repaired.

The read reference voltage VREFSA e chose level is determined according to the control code CODE<1:N> is one of the factors directly affecting the reliability of the operation of reading the fuse data FDATA in the fuse array 100.

For this reason, the value of the control code CODE<1:N> has to have high reliability, For the high reliability, the code storage block 150 which stores the control code CODE<1:N> has to exist as a separate circuit which operates by being distinguished from the fuse array 100 as shown in the drawing. Therefore, in general, the code storage block 150 stores the control code CODE<1:N> by using a single e-fuse or a metal fuse which is disposed separately from the fuse array 100.

When the code storage block 150 exists as a separate circuit which operates by being distinguished form the fuse array 100 as shown in the drawing, it may pose a concern in terms of an increase in occupying area. Particularly, a method of using the single e-fuse or the metal fuse that occupies a relatively-large area to secure the reliability of the control code CODE<1:N> for the code storage block 150 may further aggravate the concern FIG. 2 is a block diagram illustrating a semiconductor device with a fuse array in accordance with an embodiment of the present invention.

Figure 2:
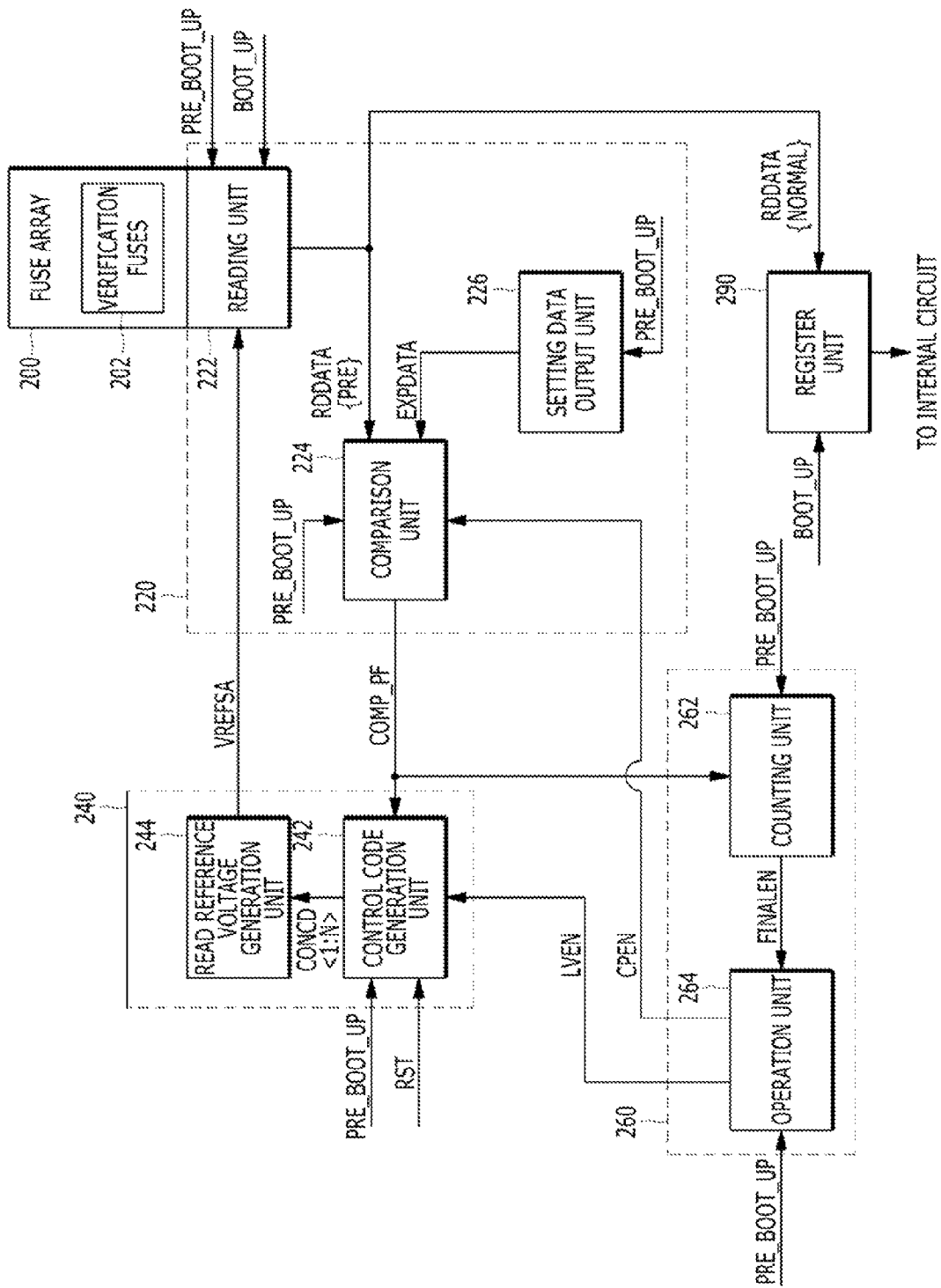
FIG. 2 is a block diagram illustrating a semiconductor device with a fuse array in accordance with an embodiment of the present invention.

Referring to FIG. 2, the semiconductor device includes a fuse array 200, a determination block 220, a level control block 240, an operation control block 260, and a register unit 290. A plurality of fuses (not shown) is included in the fuse array 200. Specifically, the fuse array may include verification fuses 202 and the other fuses, that is, normal fuse. The determination block 220 includes a reading unit 222, a comparison unit 224, and a setting data output unit 226. The level control block 240 includes a control code generation unit 242 and a read reference voltage generation unit 244. The operation control block 260 includes a counting unit 262 and an operation unit 264.

The fuse array 200 includes the fuses which are arranged in an array shape. Data EXPDATA having a predetermined value is programmed in the verification fuses 202. Fuse data FDATA programmed in the other fuses.

The determination block 220 reads the data EXPDATA having the predetermined value stored in the verification fuses 202 based on a level of a read reference voltage VREFSA during a boot-up preparation section and determines whether or not a value of a read data RDDATA{PRE} is the same as the data EXPDATA having the predetermined value. For example, when the level of the read reference voltage VREFSA is relatively low or high, a comparison signal COMP_PF outputted from the determination block 220 may be deactivated since the value of the read data RDDATA{PRE} may not be the same as the predetermined value of the data EXPDATA. On the contrary, when the read reference voltage VREFSA has a proper level, the comparison signal COMP_PF outputted from the determination block 220 may be activated since the value of the read data RDDATA{PRE} may be the same as the predetermined value of the data EXPDATA. A boot-up preparation signal PRE_BOOT_UP is activated during the boot-up preparation section.

The reading unit 222 selects and reads the data EXPDATA programmed in the verification fuses 202 based on the level of the read reference voltage VREFSA during the boot-up preparation section. That is, the reading unit 222 does not read the fuse data FDATA programmed in the other fuses during the boot-up preparation section.

The reading unit 222 uses the level of the read reference voltage VREFSA determined as a last operation result of the level control block 240 during the boot-up preparation section in a boot-up section, and reads RDDATA{NORMAL} and the fuse data FDATA programmed in the other fuses except for the verification fuses 202. The reading unit 222 does not read RDDATA{PRE} and the data EXPDATA programmed in the verification fuses 202 during the boot-up section. A boot-up signal BOOT_UP is activated during the boot-up section. Herein, "the level of the read reference voltage VREFSA" determined as a last operation result of the level control block 240" indicates "a proper level of the read reference voltage VREFSA". A detailed description thereof is provided in the description of the level control block 240 and the operation control block 260 below.

The comparison unit 224 compares the read data RDDATA{PRE} with the data EXPDATA having the predetermined value and generates the comparison signal COMP_PF which is activated based on a comparison result. For example, the comparison unit 224 activates the comparison signal COMP_PF when the value of the read data RDDATA{PRE} is the same as the predetermined value of the data EXPDATA and deactivates the comparison signal COMP_PF when the value of the read data RDDATA{PRE} is different from the predetermined value of the data EXPDATA.

The setting data output unit 226 generates the data EXPDATA having the predetermined value during the boot-up preparation section. The data EXPDATA having the predetermined value stored in the verification fuses 202 may be easily outputted in the setting data output unit 226 without being read in the verification fuses 202 since "the predetermined value" is known in advance during a semiconductor design process and generally has a quite simple pattern value. For example, when "the predetermined value" is set to "1 0 1 0", a circuit that may have the data EXPDATA having "the predetermined value" generated during the boot-up preparation section, may be formed of a few simple logic gates. Therefore, the setting data output unit 226 is a completely different circuit than the code storage block 150 shown in FIG. 1, and the area occupied by the setting data output unit 226 is extremely small.

The level control block 240 controls or adjusts, the level of the read reference voltage VREFSA in response to the operation result of the determination block 220 during the boot-up preparation section. For example, when the comparison signal COMP_PF outputted from the determination block 220 is deactivated, it means that the read data RDDATA{NORMAL} may not be normally read in the reading unit 222. Thus, the level control block 240 changes the level of the read reference voltage VREFSA. On the contrary, when the comparison signal COMP_PF outputted from the determination block 220 is activated, it means that the RDDATA{NORMAL} may be normally read in the reading unit 222. Thus, the level control block 240 does not change the level of the read reference voltage VREFSA.

The level control block 240 controls the read reference voltage VREFSA to an initialization level during an initialization section RST. The initialization section RST is a section to be entered before the boot-up preparation section. The initialization level of the read reference voltage VREFSA may be set differently based on how to change the read reference voltage VREFSA in response to the comparison signal COMP_PF. For example, when the level control block 240 changes the read reference voltage VREFSA after the initialization level of the read reference voltage VREFSA is set to be relatively low, the initialization level of the read reference voltage VREFSA may be set to increase by a predetermined level interval. On the contrary, when the level control block 240 changes the read reference voltage VREFSA after the initialization level of the read reference voltage VREFSA is set to be relatively high, the initialization level of the read reference voltage VREFSA may be set to decrease by a predetermined level interval.

The control code generation unit 242 generates a control code CONCD<1:N> which is set to an initialization value during the initialization section RST and whose value changes in response to the comparison signal COMP_PF during the boot-up preparation section For example, the value of the control code CONCD<1:N> changes when the comparison signal COMP_PF is deactivated during the boot-up preparation section. On the contrary, the value of the control code CONCD<1:N> does not change when the comparison signal COMP_PF is activated during the boot-up preparation section.

The read reference voltage generation unit 244 generates the read reference voltage VREFSA having a level corresponding to the value of the control code CONCD<1:N>. For example, the read reference voltage generation unit 244 generates the read reference voltage VREFSA having a relatively high level according to the value of the control code CONCD<1:N> having a relatively large value and the read reference voltage VREFSA having a relatively low level according to the value of the control code CONCD<1:N> having a relatively small value.

The operation control block 260 controls the determination block 220 and the level control block 240 to repeatedly operate alternately based on a first repeat number of times which is variable in response to the comparison signal COMP_PF during the boot-up preparation section.

Specifically, the operation control block 260 starts to control the determination block 220 and the level control block 240 to repeatedly operate alternately in response to the entry to the boot-up preparation section and stops controlling the determination block 220 and the level control block 240 to repeatedly operate alternately when the comparison signal COMP_PF is in an activated state while the determination block 220 and the level control block 240 repeatedly operate alternately in succession by a second repeat number of times.

The "activated state" of the comparison signal COMP_PF means a state in which the value of the read data RDDATA{NORMAL} is the same as the predetermined value of the data EXPDATA, as described in the structure of the determination block 220. That is, the operation control block 260 controls the determination block 220 and the level control block 240 to repeatedly operate alternately during the boot-up preparation section but stops controlling the determination block 220 and the level control block 240 to repeatedly operate alternately when the state in which the value of the read data RDDATA{NORMAL} is the same as the predetermined value of the data EXPDATA maintained in succession by the second repeat number of times based on the operation result of the determination block 220. The total number of times that the determination block 220 and the level control block 240 repeatedly operate alternately after entering the boot-up preparation section is the first repeat number of times. Therefore, the second repeat number of times is equal to the first repeat number of times or less. Also, the second repeat number of times is a pre-fixed value, and the first repeat number of times is a variable value based on the operation result of the determination block 220.

That is, the operation control block 260 stops controlling the determination block 220 and the level control block 240 to repeatedly operate after controlling the determination block 220 and the level control block 240 to repeatedly operate alternately by the first repeat number of times. The condition for reaching the first repeat number of times is that the state in which the value of the read data RDDATA{NORMAL} is the same as the predetermined value of the data EXPDATA maintained in succession by the second repeat number of times based on the operation result of the determination block 220.

The fact that the state in which the value of the read data RDDATA{NORMAL} is the same as the predetermined value of the data EXPDATA maintained in succession by the second repeat number of times indicates that the level of the read reference voltage VREFSA supplied to the operation of the determination block 220 is at a proper level. Therefore, after the operation control block 260 stops controlling the determination block 220 and the level control block 240 to repeatedly operate alternately, the level of the read reference voltage VREFSA generated from the level control block 240 may be qualified as the proper level that may read the fuse data FDATA programmed in the fuses (not shown) included in the fuse array 200 without failure. The operation of the reading unit 222 for reading RDDATA{NORMAL} and the fuse data FDATA programmed in the other fuses (not shown) except for the verification fuses 202, by using the level of the read reference voltage VREFSA determined as a last operation result of the level control block 240 during the boot-up preparation section in the boot-up section, may secure its reliability.

The counting unit 262 changes a counting number of times whenever the comparison signal COMP_PF of an activated state is generated based on the operation result of the determination block 220 during the boot-up preparation section, initializes the counting number of times when the comparison signal COMP_PF is deactivated and generates an operation completion signal FINALEN when the counting number of times reaches the second repeat number of times. That is, the counting unit 262 changes the counting number of times when the value of the read data RDDATA{NORMAL} is the same as the predetermined value of the data EXPDATA based on the operation result of the determination block 220 during the boot-up preparation section. When the value of the read data RDDATA{NORMAL} is different from the predetermined value of the data EXPDATA even once while the counting number of times changes, the counting number of times is initialized. Therefore, the fact that counting number of times reaches the second repeat number of times indicates that the counting unit 262 determines the state in which the value of the read data RDDATA{NORMAL} is the same as the predetermined value of the data EXPDATA in succession by the second repeat number of times based on the operation result of the determination block 220.

The operation unit 264 starts to control the determination block 220 and the level control block 240 to repeatedly operate alternately in response to the entry to the boot-up preparation section and stops controlling the determination block 220 and the level control block 240 to repeatedly operate alternately in response to the operation completion signal FINALEN. For example, the operation unit 264 controls the determination block 220 and the level control block 240 to repeatedly operate alternately in the manner of activating alternately a determination enable signal CPEN for determining whether or not the operation of the determination block 220 is enabled and a control enable signal LVEN for determining whether or not the operation of the level control block 240 is enabled during the boot-up preparation section. The operation of the determination block 220 may be repeated through an operation in which the determination enable signal CPEN is applied to the comparison unit 224 among the components of the determination block 220. Similarly, the operation of the level control block 240 may be repeated through an operation in which the control enable signal LVEN is applied to the control code generation unit 242 among the components of the level control block 240.

The register unit 290 includes a plurality of registers or latches inside, and receives and stores the data RDDATA{NORMAL} read through the reading unit 222 during the boot-up section, that is, the fuse data FDATA stored in the other fuses except for the verification fuses 202. When the fuse data FDATA is required to be used for internal circuits (not shown) of the semiconductor device, the fuse data FDATA stored as the read data RDDATA{NORMAL} is transmitted from the register unit 290 and not directly from the fuse array 200. The internal circuits of the semiconductor device may rapidly and stably receive and use the fuse data FDATA.

In the aforementioned structure, the boot-up preparation section is a section in which the boot-up preparation signal PRE_BOOT_UP is activated and is carried out ahead of the boot-up section. Similarly, the boot-up section is a section in which the boot-up signal BOOT_UP is activated and is carried out after the boot-up preparation section is carried out. Although not illustrated in the drawing, a circuit for generating the boot-up preparation signal PRE_BOOT_UP and the boot-up signal BOOT_UP may be controlled by circuits for defining operation modes of the semiconductor device inside the semiconductor device such as a Mode Register Set (MRS), and directly inputted to a controller from outside of the semiconductor device according to the device design.

Figure 3:
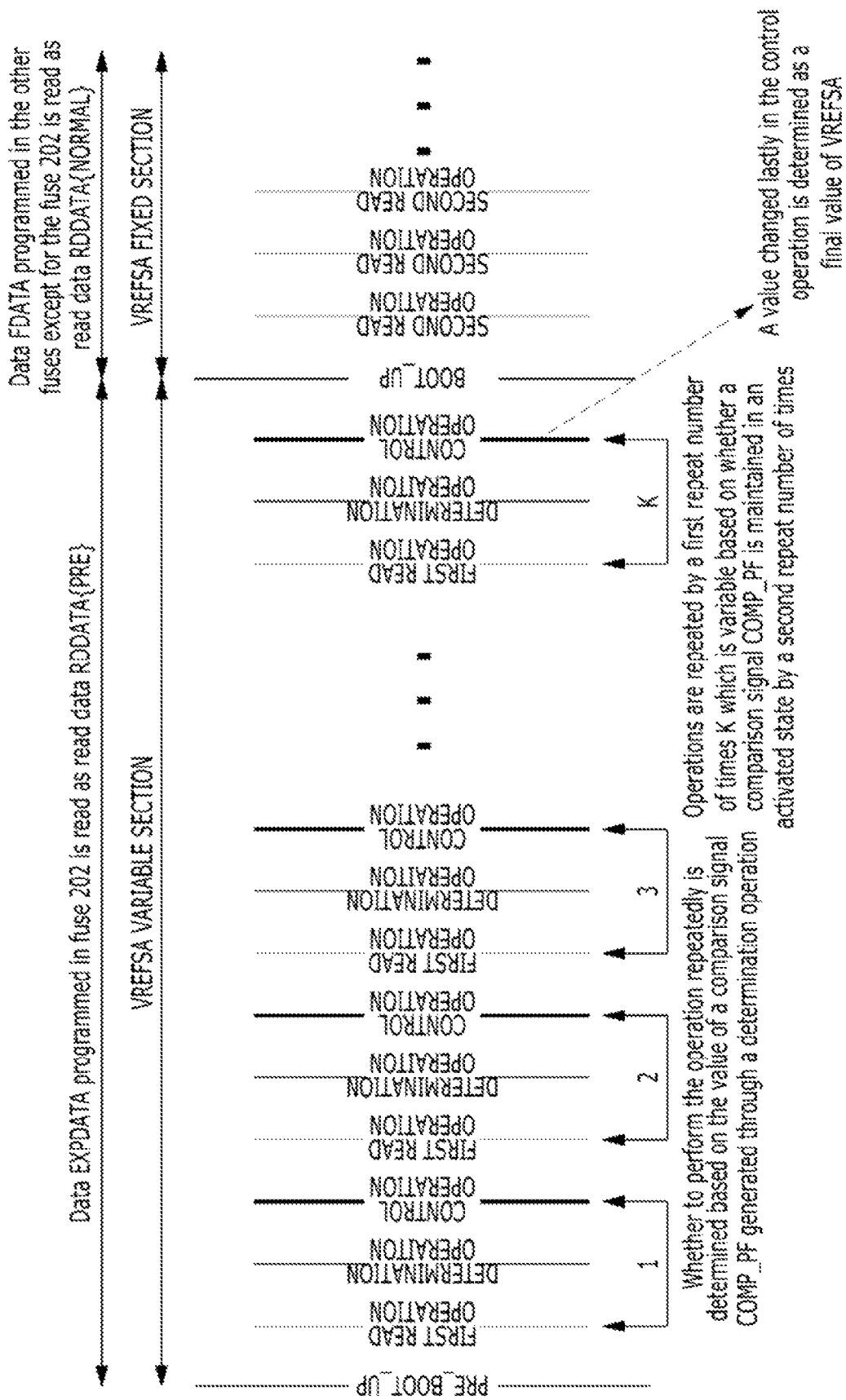
FIG. 3 is a timing diagram for describing a boot-up operation of the semiconductor device shown in FIG. 2.

FIG. 3 is a timing diagram for describing a boot-up operation of the semiconductor device shown in FIG. 2.

Referring to FIG. 3, the operation of the semiconductor device including the fuse array includes an operation of the boot-up preparation section and an operation of the boot-up section.

The boot-up preparation section may be regarded as a read reference voltage VREFSA variable section since the level of the read reference voltage VREFSA is changed to search a proper level in the section.

The boot-up section may be regarded as a read reference voltage VREFSA fixed section since the data programmed in the fuse array 200 is read in a state in which the level of the read reference voltage VREFSA determined during the boot-up preparation section is fixed.

During the boot-up preparation section, the data EXPDATA having the predetermined value programmed in the verification fuses 202 is read RDDATA{PRE} based on the level of the read reference voltage VREFSA. The reading RDDATA{PRE} of the data EXPDATA having the predetermined value programmed in the verification fuses 202 may be defined as a first read operation.

During the boot-up section, the fuse data FDATA programmed in the other fuses except for the verification fuses 202 is read RDDATA{NORMAL} based on the level of the read reference voltage VREFSA. The reading RDDATA{NORMAL} of the fuse data FDATA programmed in the other fuses may be defined as a second read operation.

An operation of determining whether or not the value of the read data RDDATA{PRE} outputted as a result of performing the first read operation is the same as the predetermined value of the data EXPDATA during the boot-up preparation section in an actual condition may be defined as a determination operation. That is, since the data EXPDATA having the predetermined value is already programmed in the verification fuses 202 at the moment when the determination operation is performed, the determination operation is an operation of determining whether or not the first read operation is properly performed.

Therefore, the determination operation performed during the boot-up preparation section is divided into two operations.

When the value of the read data RDDATA{PRE} outputted as a result of performing the first read operation is the same as the predetermined value of the data EXPDATA during the boot-up preparation section in an actual condition, the activating of the comparison signal COMP_PF may be defined as a first determination operation. Therefore, the performance of the first determination operation means that the read reference voltage VREFSA used for the first read operation is determined to have a proper level.

When the value of the read data RDDATA{PRE} outputted as a result of performing the first read operation is not the same as the predetermined value of the data EXPDATA during the boot-up preparation section in an actual condition, the deactivating of the comparison signal CO P_PF may be defined as a second determination operation. Therefore, the performance of the second determination operation means that the read reference voltage VREFSA used for the first read operation is not determined to have a proper level.

A performance result of the determination operation during the boot-up preparation section has an influence on the subsequent two operations.

First, the performance result of the determination operation during the boot-up preparation section has an influence on a control operation which controls or adjusts, the level of the read reference voltage VREFSA.

When it is determined that the first read operation is properly performed through the first determination operation during the boot-up preparation section, it may be recognized that the read reference voltage VREFSA used for the first read operation has a proper level. Thus, the level of the read reference voltage VREFSA does not change in the control operation corresponding to the first determination operation.

When it is determined that the first read operation is not properly performed through the second determination operation during the boot-up preparation section, the read reference voltage VREFSA used for the first read operation does not have a proper level. Thus, the level of the read reference voltage VREFSA changes in the control operation corresponding to the second determination operation.

Second, the performance result of the determination operation during the boot-up preparation section has an influence on the determination of whether or not the first read operation is repeatedly performed.

When it is determined that the first read operation is normally performed through the first determination operation during the boot-up preparation section, it may be recognized that the read reference voltage VREFSA used for the first read operation has a proper level. Thus, the first read operation does not need to be repeatedly performed after the control operation corresponding to the first determination operation is performed.

In the embodiment of the present invention, the first read operation is defined not to be repeatedly performed after the control operation is performed when it is determined that the first determination operation keeps being repeatedly performed in succession by the second repeat number of times. This is to repeatedly check whether or not the performance of the first determination operation is caused by a temporary error since the error may occur in the determination operation. The second repeat number of times may be controlled according to a decision of a device designer.

When it is determined that the second read operation is performed even once during the boot-up preparation section, the read reference voltage VREFSA used for the first read operation does not have a proper level. Thus, the first read operation has to be repeatedly performed after the control operation corresponding to the second determination operation is performed.

That is, the first repeat number of times K corresponding to the total number of times when the subsequent first read operation is repeatedly performed is determined based on a moment that the first determination operation is performed during the boot-up preparation section.

For example, when the second determination operation performed on a result of firstly performing the first read operation, the level of the read reference voltage VREFSA may change through the first performance of the control operation, and subsequently the first read operation may be secondly performed. When the second determination operation is performed on a result of secondly performing the first read operation, the level of the read reference voltage VREFSA may changer through the second performance of the control operation, and subsequently the first read operation may be thirdly performed. In the same manner, when the first determination operation is firstly performed on a result of seventhly performing the first read operation, the level of the read reference voltage VREFSA may not change through the seventh performance of the control operation, and subsequently the first read operation may be eighthly performed. When the first determination operation is secondly performed on a result of eighthly performing the first read operation, the level of the read reference voltage VREFSA may not change through the eighth performance of the control operation, and simultaneously the first read operation may not be performed any more. In the embodiment as described above, the first repeat number of times K is 8 and the second repeat number of times is 2.

As described above, the read reference voltage VREFSA may have a proper level while the first read operation, the determination operation and the control operation are repeatedly performed alternately by the first repeat number of times K during the boot-up preparation section. That is, the read reference voltage VREFSA may have the proper level at the moment when the boot-up preparation section is completed.

Therefore, the second read operation in which the read reference voltage VREFSA determined as a proper level due to the last performance of the control operation during the boot-up preparation section, is used during the boot-up section subsequent to the boot-up preparation section and may secure reliability.

In accordance with the embodiment of the present invention as described above, the boot-up preparation section is performed ahead of the boot-up section in which the data programmed in the fuse array 200 is read. Since the final level of the read reference voltage VREFSA is determined by training whether or not the data EXPDATA programmed in the verification fuses 202 of the fuse array 200 with a predetermined value is normally read while being repeatedly read RDDATA{PRE} by changing the level of the read reference voltage VREFSA during the boot-up preparation section, the level of the read reference voltage VREFSA may be determined to have a proper level, Particularly, the read reference voltage VREFSA having a proper level may be generated at all times regardless of a PVT variation of the semiconductor device since the level of the read reference voltage VREFSA is determined in a manner that the boot-up preparation section is automatically carried out ahead of the boot-up section.

Additionally, since a way of training in which the data EXPDATA having a predetermined value is programmed in the verification fuses 202 of the fuse array 200 is repeatedly read to output the read data RDDATA{PRE}, there is no need to dispose a separate metal fuse or a single e-fuse occupying a relatively large area in comparison with the fuse array 200 to set the level of the read reference voltage VREFSA.

Figure 4:
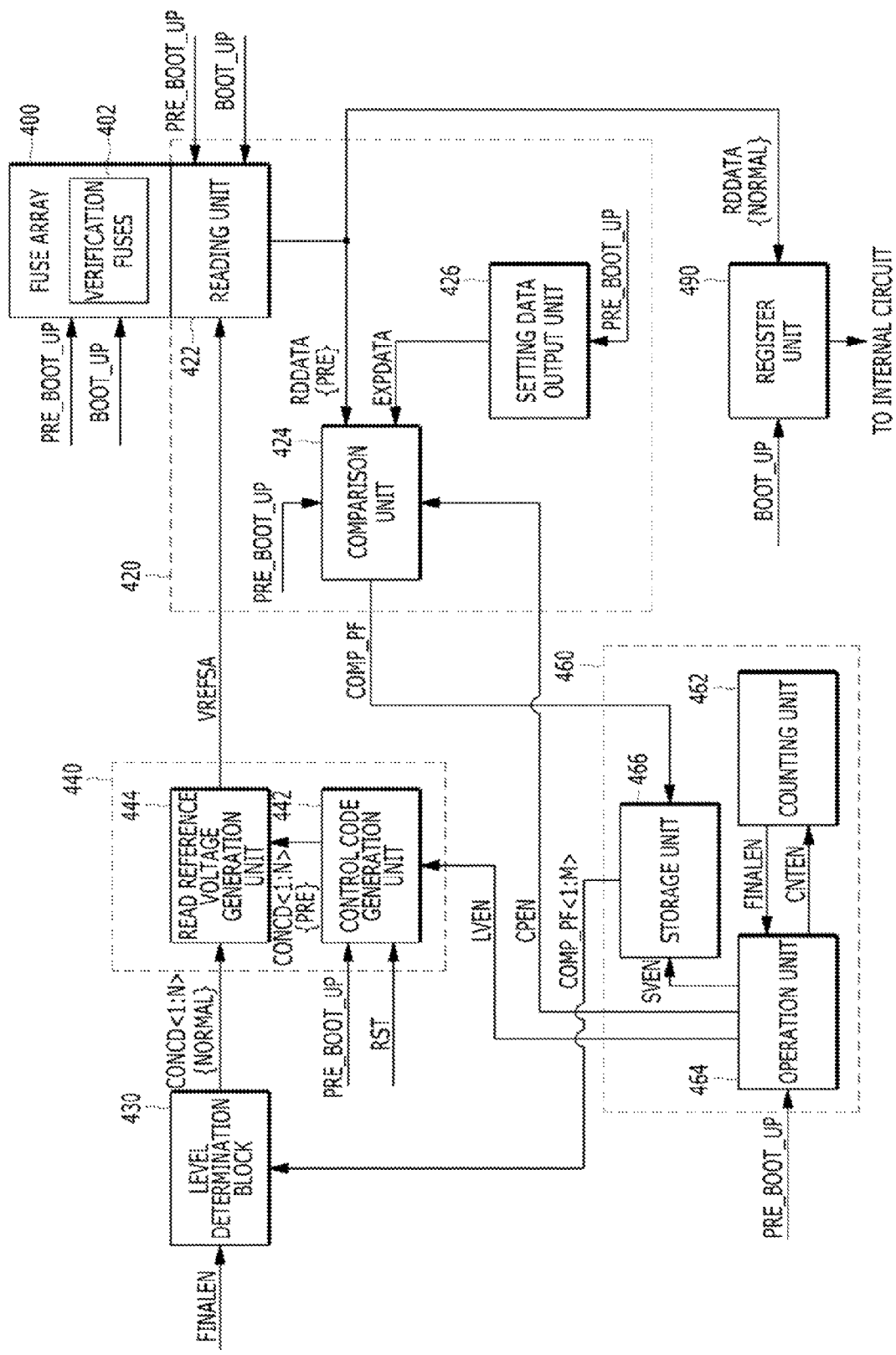
FIG. 4 is a block diagram illustrating a semiconductor device with a fuse array in accordance with an embodiment of the present invention.

FIG. 4 is a block diagram illustrating a semiconductor device with a fuse array in accordance with an embodiment of the present invention.

Referring to FIG. 4, the semiconductor device includes a fuse array 400, a determination block 420, a level control block 440, an operation control block 460, a level determination block 430, and a register unit 490. A plurality of fuses (not shown) is included in the fuse array 400. The fuse array 400 has verification fuses 402 and the other fuses that is, normal fuses. The determination block 420 includes a reading unit 422, a comparison unit 424, and a setting data output unit 426. The level control block 440 includes a control code generation unit 442 and a fuse reference voltage generation unit 444. The operation control block 450 includes a counting unit 462, an operation unit 464, and a storage unit 466.

The fuse array 400 includes the fuses which are arranged in an array shape. Data EXPDATA having a predetermined value is programmed in the verification fuses 402. Fuse data FDATA is programmed in the other fuses (not shown) except for the verification fuses 402.

The determination block 420 reads the data EXPDATA having the predetermined value stored in the verification fuses 402 to output a read data RDDATA{PRE} based on a level of a read reference voltage VREFSA during a boot-up preparation section and determines whether or not a value of the read data RDDATA{PRE} is the same as the data EXPDATA having the predetermined value. For example, when the level of the read reference voltage VREFSA is relatively low or high, a comparison signal COMP_PF outputted from the determination block 420 may be deactivated since the value of the read data RDDATA{PRE} may not be the same as the predetermined value of the data EXPDATA. On the contrary, when the read reference voltage VREFSA has a proper level, the comparison signal COMP_PF outputted from the determination block 420 may be activated since the value of the read data RDDATA{PRE} may be the same as the predetermined value of the data EXPDATA. A boot-up preparation signal PRE_BOOT_UP is activated during the boot-up preparation section.

The reading unit 422 selects and reads the data EXPDATA programmed in the verification fuses 402 based on the level of the read reference voltage VREFSA during the boot-up preparation section. That is, during the boot-up preparation section, the reading unit 422 does not read the fuse data FDATA programmed in the other fuses except for the verification fuses 402.

The reading unit 422 uses the level of the read reference voltage VREFSA controlled again by the level determination block 430 during the boot-up preparation section in a boot-up section and reads the fuse data FDATA programmed in the other fuses except for the verification fuses 402, to output a read data RDDATA{NORMAL}. The reading unit 422 does not read the data EXPDATA programmed in the verification fuses 402 during the boot-up section. A boot-up signal BOOT_UP is activated during the boot-up section. Herein, "the level of the read reference voltage VREFSA controlled again by the level determination block 430" indicates "a proper level of the read reference voltage VREFSA". A detailed description thereof is provided in a description of the level control block 440, the level determination block 430 and the operation control block 460 below.

The comparison unit 424 compares the value of the read data RDDATA{PRE} of the reading unit 422 with the data EXPDATA having the predetermined value and generates the comparison signal COMP_PF activated based on a comparison result. For example, the comparison unit 424 activates the comparison signal COMP_PF when the value of the read data RDDATA{NORMAL} of the reading unit 422 is the same as the predetermined value of the data EXPDATA and deactivates the comparison signal COMP_PF when the value of the read data RDDATA{NORMAL} is different from the predetermined value of the data EXPDATA.

The setting data output unit 426 generates the data EXPDATA having the predetermined value during the boot-up preparation section. Herein, the data EXPDATA having the predetermined value stored in the verification fuses 402 may be easily outputted in the setting data output unit 426 without being read in the verification fuses 402 since "the predetermined value" is known in advance during a semiconductor design process and generally has a quite simple pattern value. For example, when "the predetermined value" is set to "1 0 1 0", a circuit that may have the data EXPDATA having "the predetermined value" generated during the boot-up preparation section may be formed of a few simple logic gates. Therefore, the setting data output unit 426 is a completely different circuit than the code storage block 150 shown in FIG. 1, and the area occupied by the setting data output unit 426 is extremely small.

The level control block 440 controls or adjusts, the level of the read reference voltage VREFSA whenever its operation is repeated during the boot-up preparation section. For example, the level of the read reference voltage VREFSA determined by the level control block 440 in its second operation may be higher or lower by a predetermined level interval than the level of the read reference voltage VREFSA determined by the level control block 440 in its first operation.

The level control block 440 controls or adjusts the read reference voltage VREFSA to an initialization level during an initialization section RST. The initialization section RST is a section to be entered before the boot-up preparation section. The initialization level of the read reference voltage VREFSA may be set differently based on how to change the read reference voltage VREFSA whenever its operation is repeated. For example, when the level control block 440 repeatedly operates and changes the read reference voltage VREFSA after the initialization level of the read reference voltage VREFSA is set to be relatively low, the initialization level of the read reference voltage VREFSA may be set to increase by a predetermined level interval. On the contrary, when the level control block 440 repeatedly operates and changes the read reference voltage VREFSA after the initialization level of the read reference voltage VREFSA is set to be relatively high, the initialization level of the read reference voltage VREFSA may be set to decrease by a predetermined level interval.

The control code generation unit 442 generates a control code CONCD<1:N>{PRE} which is set to an initialization value during the initialization section RST and whose value changes whenever its operation is repeated during the boot-up preparation section.

The read reference voltage generation unit 444 generates the read reference voltage VREFSA having a level corresponding to the value of the control code CONCD<1:N>{PRE}. For example, the read reference voltage generation unit 444 generates the read reference voltage VREFSA having a relatively high level according to the value of the control code CONCD<1:N>{PRE} having a relatively large value and the read reference voltage VREFSA having a relatively low level according to the value of the control code CONCD<1:N>{PRE} having a relatively small value.

The operation control block 460 controls the determination block 420 and the level control block 440 to repeatedly operate alternately based on a third repeat number of times M which is fixed in response to the comparison signal COMP_PF during the boot-up preparation section and stores the comparison signal COMP_PF generated from the determination block 420 as a signal COMP_PF<1:M> whenever the determination block 420 and the level control block 440 repeatedly operate.

The counting unit 462 increases a counting number of times whenever the determination block 420 and the level control block 440 operates alternately during the boot-up preparation section and generates an operation completion signal FINALEN when the counting number of times reaches the third repeat number of times M.

The operation unit 464 starts to control the determination block 420 and the level control block 440 to repeatedly operate alternately in response to the entry to the boot-up preparation section and stops controlling the determination block 420 and the level control block 440 to repeatedly operate alternately in response to the operation completion signal FINALEN. For example, the operation unit 464 controls the determination block 420 and the level control block 440 to repeatedly operate alternately in the manner of repeatedly activating alternately a determination enable signal CPEN to determine whether or not the operation of the determination block 420 is enabled and a control enable signal LVEN to determine whether or not the operation of the level control block 440 is enabled during the boot-up preparation section. The operation of the determination block 420 may be repeated through an operation where the determination enable signal CPEN is applied to the comparison unit 424 among the components of the determination block 420. Similarly, the operation of the level control block 440 may be repeated through an operation where the control enable signal LVEN is applied to the control code generation unit 442 among the components of the level control block 440.

The storage unit 466 stores the comparison signal COMP_PF generated from the determination block 420 as the signal COMP_PF<1:M> whenever the determination block 420 and the level control block 440 repeatedly operate alternately during the boot-up preparation section. That is, the storage unit 466 sequentially stores the comparison signal COMP_PF as signal COMP_PF<1:M> whenever the determination block 420 and the level control block 440 repeatedly operate alternately regardless of whether the comparison signal COMP_PF generated from the determination block 420 is of an activated state or a deactivated state. Therefore, the total number of the comparison signal COMP_PF stored as the signal COMP_PF<1:M> in the storage unit 466 is equal to the value corresponding to the third repeat number of times M.

The activated state of the comparison signal COMP_PF means a state in which the value of the read data RDDATA{NORMAL} is the same as the predetermined value of the data EXPDATA as described in the structure of the determination block 420. On the contrary, the deactivated state of the comparison signal COMP_PF means a state where the value of the read data RDDATA{NORMAL} is not the same as the predetermined value of the data EXPDATA as described in the structure of the determination block 420.

The level of the read reference voltage VREFSA may change in one direction from an initial level when the level control block 440 repeatedly operates regardless of whether the comparison signal COMP_PF is of the activated state or the deactivated state. For example, the read reference voltage VREFSA may continuously increase by a predetermined level internal and have a relatively high level when the level control block 440 repeatedly operates regardless of whether the comparison signal COMP_PF is of the activated state or the deactivated state under the assumption that the initial level of the read reference voltage VREFSA is relatively low.

When the determination block 420 repeatedly operates regardless of whether the comparison signal COMP_PF is of the activated state or the deactivated state by using the variable level of the read reference voltage VREFSA, the comparison signal COMP_PF that maintains in the deactivated state at an initial period time may be changed to the activated state at a predetermined moment, and subsequently may be changed to the deactivated state at another predetermined moment.

Therefore, the state change of the comparison signal COMP_PF which maintains in the deactivated state, and then is changed to the activated state at a predetermined moment, and subsequently may be changed to the deactivated state again at another predetermined moment, may be stored as the signal COMP_PF<1:M> in the storage unit 466.

The state change of the comparison signal COMP PF is under the presumption that an operation section in which the read reference voltage VREFSA has a proper level in the repeat operation process of the level control block 440 is not a repeat operation section at an initial period time or a repeat operation section as a last period time but a repeat operation section at a medium period time.

When it is presumed that the operation section in which the read reference voltage VREFSA has a proper level in the repeat operation process of the level control block 440 is the repeat operation section at the initial period time, the state change of the comparison signal COMP_PF which is maintained in the activated state and is changed to the deactivated state at a predetermined moment may be stored in the storage unit 466.

Similarly, when it is presumed that the operation section in which the read reference voltage VREFSA has a proper level in the repeat operation process of the level control block 440 is the repeat operation section at the last period time, the state change of the comparison signal COMP_PF which is maintained in the deactivated state and is changed to the activated state at a predetermined moment may be stored in the storage unit 466.

The level determination block 430 controls or adjusts, the level of the read reference voltage VREFSA outputted from the level control block 440 again in response to the level change state COMP_PF<1:M> of the comparison signal COMP_PF corresponding to the third repeat number of times M stored in the storage unit 466 after the repeat operations of the determination block 420 and the level control block 440 by the operation control block 460 stop during the boot-up preparation section. That is, the level determination block 430 controls the level of the read reference voltage VREFSA to a proper level again in response to the level change state COMP_PF<1:M> of the comparison signal COMP_PF corresponding to the third repeat number of times M stored in the storage unit 466. A method of controlling or adjusting the read reference voltage VREFSA to a proper level again in the level determination block 430 may be a method of selecting an activated state of one disposed in the middle of a section in which the comparison signal COMP_PF is maintained in the activated state in the level change state COMP_PF<1:M> of the comparison signal COMP_PF corresponding to the third repeat number of times M stored in the storage unit 466.

That is, the level of the read reference voltage VREFSA generated from the level control block 440 may not be recognized as a proper level readable of the fuse data FDATA programmed in the fuses (not shown) included in the fuse array 400 without failure after the operation control block 460 stops controlling the determination block 420 and the level control block 440 to repeatedly operate alternately.

Instead, the level >of the read reference voltage VREFSA which is controlled or adjusted again by controlling an operation of the level control block 440 by the level determination block 430 may be recognized as a proper level readable of the fuse data FDATA programmed in the fuses (not shown) included in the fuse array 400 without failure after the operation control block 460 stops controlling the determination block 420, the level control block 440 and the storage unit 466 to repeatedly operate alternately. Therefore, the operation of the reading unit 422 in which the level of the read reference voltage VREFSA controlled again by the level determination block 430 during the boot-up preparation section is used in the boot-up section, and the fuse data FDATA programmed in the other fuses except for the verification fuses 402 is read as the read data RDDATA{NORMAL} and may be an operation of securing reliability.

A method of controlling an operation of the level control block 440 in the level determination block 430 may be a method of directly controlling an operation of the read reference voltage generation unit 444 by using the state change COMP_PF<1:M> of the comparison signal COMP_PF by the third repeat number of times M stored in the storage unit 466 as illustrated in the drawing.

The register unit 490 includes a plurality of registers or latches inside, and receives and stores the read data RDDATA{NORMAL} read through the reading unit 422 during the boot-up section, that is, the fuse data FDATA stored in the other fuses except for the verification fuses 402. When the fuse data FDATA is required to be used for internal circuits (not shown) of the semiconductor device, the fuse data FDATA stored as the read data RDDATA{NORMAL} is transmitted from the register unit 490 and not directly from the fuse array 400. The internal circuits of the semiconductor device may rapidly and stably receive and use the fuse data FDATA.

In the aforementioned structure, the boot-up preparation signal PRE_BOOT_UP is activated during the boot-up preparation section. The boot-up preparation section is ahead of the boot-up section. Similarly, the boot-up signal BOOT_UP is activated during the boot-up section. Although not illustrated in the drawing, a circuit for generating the boot-up preparation signal PRE_BOOT_UP and the boot-up signal BOOT_UP may be controlled by circuits for defining operation modes of the semiconductor device inside the semiconductor device such as a Mode Register Set (MRS) and directly inputted to a controller from outside of the semiconductor device according to a decision of a device designer.

Figure 5:
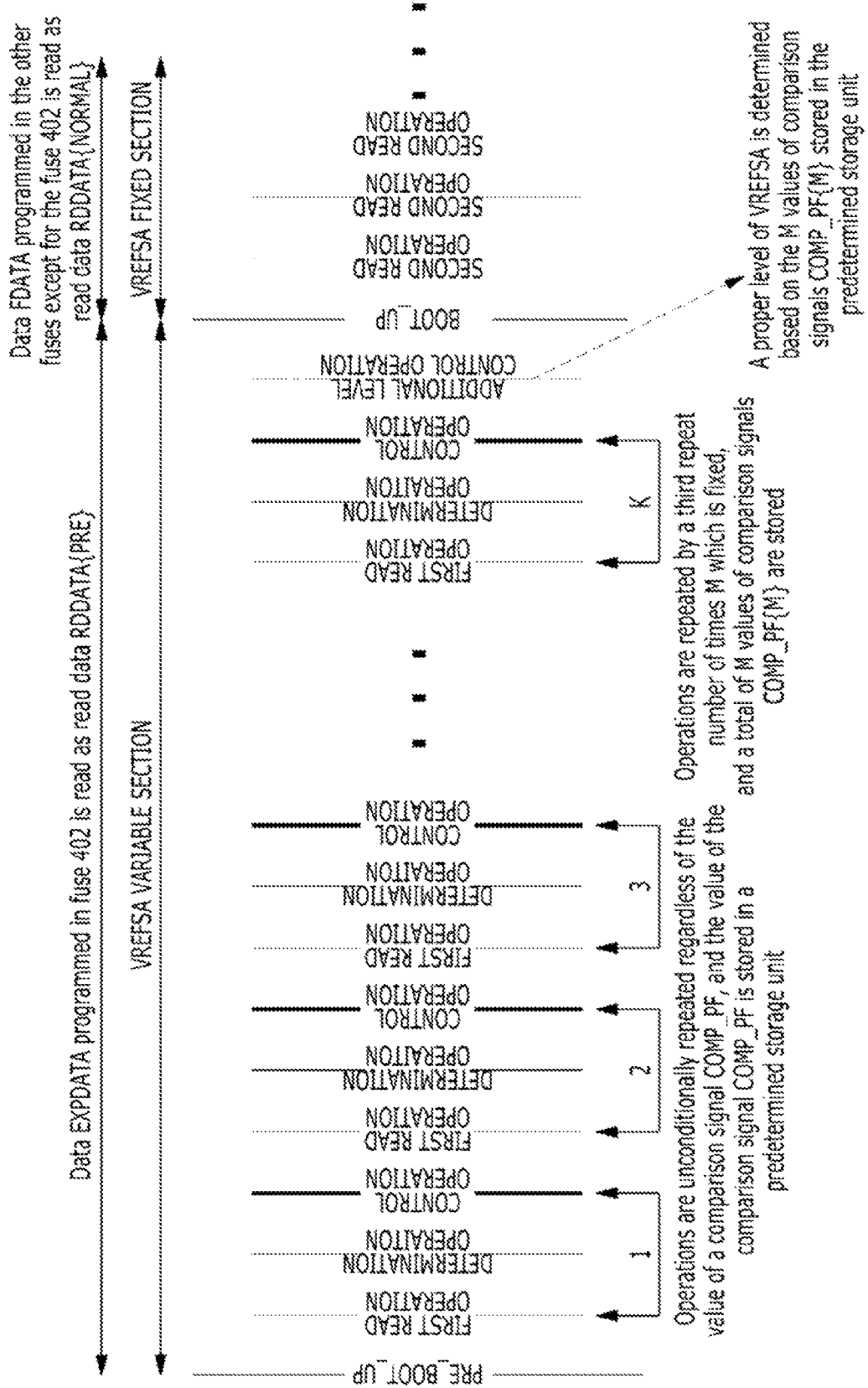
FIG. 5 is a timing diagram for describing a boot-up operation of the semiconductor device shown in FIG. 4.

FIG. 5 is a timing diagram for describing a boot-up operation of the semiconductor device shown in FIG. 4.

Referring to FIG. 5, the operation of the semiconductor device including the fuse array includes an operation of the boot-up preparation section and an operation of the boot-up section.

The boot-up preparation section may be regarded as a read reference voltage VREFSA variable section since the level of the read reference voltage VREFSA is changed to search a proper level in the section.

The boot-up section may be regarded as a read reference voltage VREFSA fixed section since the data programmed in the fuse array 400 is read in a state in which the level of the read reference voltage VREFSA determined during the boot-up preparation section is fixed.

During the boot-up preparation section, the data EXPDATA having the predetermined value programmed in the verification fuses 402, is read as the read data RDDATA{PRE} based on the level of the read reference voltage VREFSA. The reading of the data EXPDATA having the predetermined value programmed in the verification fuses 402 as the read data RDDATA{PRE} may be defined as a first read operation.

During the boot-up section, the fuse data FDATA programmed in the other fuses except for the verification fuses 402 is read as the read data RDDATA{NORMAL} based on the level of the read reference voltage VREFSA, The reading of the fuse data FDATA programmed in the other fuses as the read data RDDATA{NORMAL} may be defined as a second read operation.

An operation of determining whether or not the value of the read data RDDATA{PRE} outputted as a result of performing the first read operation is the same as the predetermined value of the data EXPDATA during the boot-up preparation section in an actual condition may be defined as a determination operation. That is, since the data EXPDATA having the predetermined value is already programmed in the verification fuses 402 at the moment when the determination operation is performed, the determination operation is an operation of determining whether or not tine first read operation is properly performed.

Therefore, the determination operation performed during the boot-up preparation section is divided into two operations.

When the value of the read data RDDATA{PRE} outputted as a result of performing the first read operation is the same as the predetermined value of the data EXPDATA during the boot-up preparation section in an actual condition, the activating of the comparison signal COMP_PF may be defined as a first determination operation. Therefore, the performance of the first determination operation means that the read reference voltage VREFSA used for the first read operation is determined to have a proper level.

When the value of the read data RDDATA{PRE} outputted as a result of performing the first read operation is not the same as the predetermined value of the data EXPDATA during the boot-up preparation section in an actual condition, the deactivating of the comparison signal COMP PF may be defined as the second determination operation. Therefore, the performance of the second determination operation means that the read reference voltage VREFSA used for the first read operation is not determined to have a proper level.

During the boot-up preparation section, the first read operation, the determination operation and a control operation are repeatedly performed alternately by the third repeat number of times M. The control operation is an operation of changing the level of the read reference voltage VREFSA. Whenever the control operation is repeated, the level of the read reference voltage VREFSA changes. That is, the control operation changes the level of the read reference voltage VREFSA by a predetermined level interval whenever the control operation is repeated during the boot-up preparation section after the level of the read reference voltage VREFSA is initialized during an initialization section.

During the boot-up preparation section, a result of performing the determination operation is stored in a predetermined storage unit. That is, an activated state or a deactivated state of the comparison signal COMP_PF as the result of the performance of the determination operation is stored in the predetermined storage unit regardless of whether the first determination operation is performed or the second determination operation is performed. The determination operation is repeatedly performed by the third repeat number of times M, and the comparison signal COMP_PF obtained as the result of the performance is generated as many as the third repeat number of times. The comparison signal COMP_PF corresponding to the third repeat number of times M is stored as the signal COMP_PF<1:M> in the predetermined storage unit.

Specifically, the level of the read reference voltage VREFSA may change in one direction from an initial level when the control operation is repeatedly performed by the third repeat number of times M. For example, the read reference voltage VREFSA may continuously increase by a predetermined level internally and have a relatively high level when the control operation is repeatedly performed under the presumption that the initial level of the read reference voltage VREFSA is relatively low.

When the determination operation is repeatedly performed by the third repeat number of times M regardless of whether the comparison signal COMP_PF is of the activated state or the deactivated state by using the variable level of the read reference voltage VREFSA, the comparison signal COMP_PF that maintains the deactivated state at an initial period time may be changed to the activated state at a predetermined moment, and subsequently may be changed to the deactivated state at another predetermined moment.

Therefore, the state change of the comparison signal COMP_PF which maintains the deactivated state, and then is changed to the activated state at a predetermined moment, and subsequently may be changed to the deactivated state again at another predetermined moment may be stored as the signal COMP_PF<1:M> in the predetermined storage unit.

The above-described state change of the comparison signal COMP_PF is a case in which an operation section in which the read reference voltage VREFSA has a proper level in the repeat operation process of the control operation is not a repeat operation section in an initial period time or a repeat operation section in a last period time but a repeat operation section in a medium period time.

When it is presumed that the operation section in which the read reference voltage VREFSA has a proper level in the repeat operation process of the control operation is the repeat operation section in the initial period time, the state change of the comparison signal COMP_PF which maintains the activated state and is changed to the deactivated state at a predetermined moment may be stored in the predetermined storage unit.

Similarly, when it is assumed that the operation section in which the read reference voltage VREFSA has a proper level in the repeat operation process of the control operation is the repeat operation section in the last period time, the state change of the comparison signal COMP_PF which maintains the deactivated state and is changed to the activated state at a predetermined moment may be stored in the predetermined storage unit.

When the first read operation, the determination operation and the control operation are repeatedly performed alternately by the third repeat number of times M during the-boot-up preparation section, the determination operation and the control operation are performed no longer, and subsequently an additional level control operation is performed.

The additional level control operation is an operation of controlling or adjusting, the level of the read reference voltage VREFSA again in response to the level change state COMP_PF<1:M> of the comparison signal COMP_PF corresponding to the number corresponding to the third repeat number of times M stored in the predetermined storage unit. That is, the additional level control operation controls the level of the read reference voltage VREFSA to a proper level again in response to the level change state COMP_PF<1:M> of the comparison signal COMP_PF corresponding to the third repeat number of times M stored in the predetermined storage unit. A method of controlling the level of the read reference voltage VREFSA to a proper level again in the additional level control operation may be a method of selecting an activated state of one disposed in the middle of a section in which the comparison signal COMP_PF maintains the activated state in the level change state COMP_PF<1:M> of the comparison signal COMP_PF corresponding to the third repeat number of times M stored in the predetermined storage unit.

That is the level of the read reference voltage VREFSA generated from the last operation of the control operation may not be recognized as a proper level readable of the fuse data FDATA programmed in the fuses (not shown) included in the fuse array 400 without failure after the first read operation, the determination operation and the control operation stop being repeatedly performed alternately by the third repeat number of times M during the boot-up preparation section.

Instead, the level of the read reference voltage VREFSA which is controlled again through the additional level control operation may be recognized as a proper level readable of the fuse data FDATA programmed in the fuses (not shown) included in the fuse array 400 without failure after the first read operation, the determination operation and the control operation stop being repeatedly performed alternately by the third repeat number of times M during the boot-up preparation section. Therefore, the second read operation where the level of the read reference voltage VREFSA controlled again through the additional level control operation during the boot-up preparation section is used in the boot-up section, and the fuse data FDATA programmed in the other fuses except for the verification fuses 402 is read as the read data read data RDDATA{NORMAL} may be an operation for securing reliability.

In accordance with the embodiment of the present invention as described above, the boot-up preparation section is performed ahead of the boot-up section in which the data programmed in the fuse array 400 is read. Since the final level of the read reference voltage VREFSA is determined in a way of training, whether or not the data EXPDATA programmed in the verification fuses 402 of the fuse array 400 with a predetermined value is normally read while being repeatedly read RDDATA{PRE} by changing the level of the read reference voltage VREFSA during the boot-up preparation section, the level of the read reference voltage VREFSA may be determined to have a proper level.

Particularly, the read reference voltage VREFSA having a proper level may be generated at all times regardless of a PVT variation of the semiconductor device since the level of the read reference voltage VREFSA is determined in a way that the boot-up preparation section is automatically carried out ahead of the boot-up section.

Additionally, since a way of training in which the data EXPDATA having a predetermined value is programmed in the verification fuses 402 of the fuse array 400 is repeatedly read to output the read data RDDATA{PRE}, there is no need to dispose a separate metal fuse or a single e-fuse occupying a relatively large area in comparison with the fuse array 400 to set the level of the read reference voltage VREFSA.

While the present invention has been described with respect to the specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

Furthermore, dispositions and types of the logic gates and transistors described in the aforementioned embodiments may be implemented differently based on a polarity of an inputted signal.

What is claimed is:

1. A semiconductor device, comprising:
a fuse array including verification fuses and normal fuses;
a determination block suitable for reading data programmed in the verification fuses based on a read reference voltage and during a boot-up preparation section, determining whether or not a read value is the same as a predetermined value; and
a level control block suitable for adjusting a level of the read reference voltage based on a determined result during the boot-up preparation section,
wherein the level control block controls the read reference voltage to an initialization level during an initialization section that is to be entered before the boot-up preparation section.

2. The semiconductor device of claim 1, wherein the predetermined value is a value, which is programmed in the verification fuses.

3. The semiconductor device of claim 2, wherein the determination block includes:
a reading unit suitable for selecting and reading the data programmed in the verification fuses based on the read reference voltage during the boot-up preparation section; and
a comparison unit suitable for comparing the read value of the reading unit with the predetermined value to generate a comparison signal, which is activated when a read value of the reading unit is the same as the predetermined value and deactivated when the read value of the reading unit is different from the predetermined value during the boot-up preparation section.

4. The semiconductor device of claim 3, further comprising:
an operation control block suitable for controlling the determination block and the level control block to repeatedly operate alternately based on a first repeat number of times, which is variable according to the comparison signal, during the boot-up preparation section.

5. The semiconductor device of claim 4, wherein the operation control block starts to control the determination block and the level control block to repeatedly operate alternately in response to an entry to the boot-up preparation section, and stops controlling the determination block and the level control block to repeatedly operate alternately when the comparison signal is in an activated state while the determination block and the level control block repeatedly operate by a second repeat number of times, which is equal to or less than the first repeat number of times.

6. The semiconductor device of claim 5, the operation control block includes:
a counting unit suitable for changing a counting number of times based on an operation result of the determination block whenever the comparison signal of the activated state is generated, initializing the counting number of times when the comparison signal is deactivated, and generating an operation completion signal when the counting number of times reaches the second repeat number of times, during the boot-up preparation section; and
an operation unit suitable for starting to control the determination block and the level control block to repeatedly operate in response to the entry to the boot-up preparation section, and stopping controlling the determination block and the level control block to repeatedly operate in response to the operation completion signal.

7. The semiconductor device of claim 5, wherein the reading unit reads data programmed in the normal fuses based on the read reference voltage having a level determined by the level control block during a boot-up section.

8. The semiconductor device of claim 3, further comprising:
an operation control block suitable for controlling the determination block and the level control block to repeatedly operate based on a third repeat number of times, which is fixed, to store the comparison signal generated at each repeat operation, during the boot-up preparation section.

9. The semiconductor device of claim 8, wherein the operation control block includes:
a counting unit suitable for changing a counting number of times whenever the determination block and the level control block repeatedly operate to generate an operation completion signal when the counting number of times reaches the third repeat number of times during the boot-up preparation section;
an operation unit suitable for starting to control the determination block and the level control block to repeatedly operate in response to the entry to the boot-up preparation section, and stopping control of the determination block and the level control block to repeatedly operate based on the operation completion signal; and
a storage unit suitable for storing the comparison signal generated from the determination block whenever the determination block and the level control block repeatedly operate during the boot-up preparation section.

10. The semiconductor device of claim 9, further comprising:
a level determination block suitable for adjusting a level of the read reference voltage in response to a level change state of the comparison signal corresponding to the third repeat number of times stored in the storage unit after repeat operations of the determination block and the level control block are stopped by the operation control block, during the boot-up preparation section.

11. The semiconductor device of claim 10, wherein the reading unit read data programmed in the normal fuses based on the read reference voltage adjusted by the level determination block, during a boot-up section.

12. A method for operating a semiconductor device with a fuse array including first fuses and second fuses, the method comprising:
performing a first read operation by reading data programmed in the first fuses based on a read reference voltage to produce a read data, during a boot-up preparation section;
performing a determination operation by determining whether or not a value of the read data is the same as a predetermined value, which is programmed, to produce a determination result, during the boot-up preparation section; and performing a control operation by varying a level of the read reference voltage based on the determination result during the boot-up preparation section,
wherein the read reference voltage is controlled to an initialization level during an initialization section that is to be entered before the boot-up preparation section.

13. The method of claim 12, wherein the performing of the determination operation includes:
activating a comparison signal when a value of the read data is the same as the predetermined value, during the boot-up preparation section; and
deactivating the comparison signal when a value of the read data is different from the predetermined value, during the boot-up preparation section.

14. The method of claim 13, further comprising:
alternately repeating the performing of the determination operation and the performing of the control operation according to a first repeat number of times, which is variable based on the comparison signal, during the boot-up preparation section.

15. The method of claim 14, wherein the repeating of the operations includes:
starting to alternately repeat the performing of the determination operation and the performing of the control operation in response to an entry to the boot-up preparation section; and
stopping alternately repeating the performing of the determination operation and the performing of the control operation when the comparison signal is in an activated state while the repeating of the operations are successively performed by a second repeat number of times, which is equal to or less than the first repeat number of times.

16. The method of claim 15, further comprising:
performing a second read operation by reading data programmed in the second fuses is read based on the read reference voltage of which a voltage level is determined in the last control operation, during a boot-up section.

17. The method of claim 13, further comprising:
alternately repeating the performing of the determination operation and the performing of the control operation by a third repeat number of times, which is fixed, to store the comparison signal generated at each repeat performance, during the boot-up preparation section.

18. The method of claim 17, wherein the repeating of the operations includes:
starting to alternately repeat the performing of the determination operation and the performing of the control operation voltage in response to an entry to the boot-up preparation section;
storing the comparison signal generated in the performing of the determination operation whenever the determination operation and the performing of the control operation are alternately repeated, during the boot-up preparation section; and
stopping alternately repeating the performing of the determination operation and the performing of the control operation when the repeated number of times equals the third repeat number of times.

19. The method of claim 18, further comprising:
performing an additional control operation by adjusting a level of the read reference voltage in response to a level change state of the comparison signal corresponding to the stored third repeat number of times, after the repeating of the operations stops, during the boot-up preparation section; and
performing a second read operation by reading data programmed in the second fuses based on a level of the read reference voltage determined in the performing of the additional control operation, during a boot-up section.

20. A method for operating a semiconductor device with a fuse array including first fuses and second fuses, the method comprising:
reading data programmed in the first fuses based on a read reference voltage during a boot-up preparation section;
adjusting a level of the read reference voltage based on the read data during the boot-up preparation section; and
reading data programmed in the second fuses based on the adjusted read reference voltage during a boot-up section,
wherein the read reference voltage is controlled to an initialization level during an initialization section that is to be entered before the boot-up preparation section.

* * * * *